US006781868B2

(12) United States Patent
Bulovic et al.

(10) Patent No.: US 6,781,868 B2
(45) Date of Patent: Aug. 24, 2004

(54) MOLECULAR MEMORY DEVICE

(75) Inventors: Vladimir Bulovic, Cambridge, MA (US); Aaron Mandell, Boston, MA (US); Andrew Perlman, Boston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/139,747

(22) Filed: May 7, 2002

(65) Prior Publication Data

US 2002/0163830 A1 Nov. 7, 2002

Related U.S. Application Data

(60) Provisional application No. 60/289,056, filed on May 7, 2001.

(51) Int. Cl.[7] ................................................ G11C 13/00
(52) U.S. Cl. ........................ 365/151; 365/151; 365/153
(58) Field of Search ................................ 365/151, 114, 365/163, 201; 257/315, 288, 40; 428/220

(56) References Cited

U.S. PATENT DOCUMENTS

| | | | |
|---|---|---|---|
| 3,719,933 A | | 3/1973 | Wakabayashi et al. |
| 3,810,127 A | | 5/1974 | Hoff, Jr. |
| 3,833,894 A | * | 9/1974 | Aviram et al. ............. 365/151 |
| 4,267,558 A | | 5/1981 | Guterman |
| 4,267,583 A | | 5/1981 | Suzuki |
| 4,371,883 A | | 2/1983 | Potember et al. |
| 4,616,340 A | | 10/1986 | Hayashi et al. |
| 4,631,562 A | | 12/1986 | Avery |
| 4,652,894 A | | 3/1987 | Potember et al. |
| 4,677,742 A | | 7/1987 | Johnson |
| 4,727,514 A | | 2/1988 | Bhuva et al. |
| 4,733,375 A | | 3/1988 | Terashima |
| 4,834,911 A | | 5/1989 | Carew |

(List continued on next page.)

FOREIGN PATENT DOCUMENTS

| | | |
|---|---|---|
| DE | 196 40 239 A1 | 4/1998 |
| DE | 199 59 904 A1 | 6/2001 |

(List continued on next page.)

OTHER PUBLICATIONS

Reed, M.A. et al., "Molecular Random Access Memory Cell," *Applied Physics Letters*, vol. 78, No. 23, pp. 3735–3737, Jun. 4, 2001.

Rossell, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Stikeman, Alexandra, "Polymer Memory: The Plastic Path to Better Data Storage," *Technology Review*, p. 31, Sep. 2002.

(List continued on next page.)

*Primary Examiner*—David Nelms
*Assistant Examiner*—Thinh T Nguyen
(74) *Attorney, Agent, or Firm*—Amin & Turocy, LLP

(57) ABSTRACT

A novel memory cell is provided with an active region including a molecular system and ionic complexes distributed in the molecular system. A pair of write electrodes are arranged for writing information to the memory cell. The active region is responsive to an electric field applied between the pair of write electrodes for switching between an on state and an off state. The active region has a high impedance in the off state and a low impedance in the on state. A pair of read electrodes is used to detect whether the active region is in the on state or in the off state to read the information from the memory cell. Read electrodes may be made of different materials having different work functions to reduce leakage current.

45 Claims, 3 Drawing Sheets

U.S. PATENT DOCUMENTS

| | | | |
|---|---|---|---|
| 4,839,700 | A | 6/1989 | Ramesham et al. |
| 4,860,254 | A | 8/1989 | Pott et al. |
| 5,012,445 | A | 4/1991 | Kazuaki et al. |
| 5,034,192 | A | 7/1991 | Wrighton et al. |
| 5,130,380 | A | 7/1992 | Carew |
| 5,136,212 | A | 8/1992 | Eguchi et al. |
| 5,153,681 | A * | 10/1992 | Kishimoto et al. ......... 257/288 |
| 5,196,912 | A | 3/1993 | Matsumoto et al. |
| 5,206,525 | A * | 4/1993 | Yamamoto et al. ........... 257/40 |
| 5,240,762 | A * | 8/1993 | Miura et al. ................ 428/220 |
| 5,245,543 | A | 9/1993 | Smayling et al. |
| 5,296,716 | A | 3/1994 | Ovshinsky et al. |
| 5,315,131 | A | 5/1994 | Kishimoto et al. |
| 5,319,564 | A | 6/1994 | Smayling et al. |
| 5,355,235 | A | 10/1994 | Nishizawa et al. |
| 5,392,236 | A | 2/1995 | Hashimoto |
| 5,412,614 | A | 5/1995 | Bird |
| RE34,974 | E | 6/1995 | Terashima |
| 5,431,883 | A | 7/1995 | Barraud |
| 5,440,518 | A | 8/1995 | Hazani |
| 5,563,081 | A | 10/1996 | Ozawa |
| 5,572,472 | A | 11/1996 | Kearney et al. |
| 5,579,199 | A | 11/1996 | Kawamura et al. |
| 5,670,818 | A | 9/1997 | Forouhi et al. |
| 5,691,935 | A | 11/1997 | Douglass |
| 5,698,874 | A | 12/1997 | Hayashi |
| 5,734,605 | A | 3/1998 | Zhu et al. |
| 5,761,115 | A | 6/1998 | Kozicki et al. |
| 5,770,885 | A | 6/1998 | McCollum et al. |
| 5,818,749 | A | 10/1998 | Harshfield |
| 5,849,403 | A | 12/1998 | Aoki et al. |
| 5,869,882 | A | 2/1999 | Chen et al. |
| 5,896,312 | A | 4/1999 | Kozicki et al. |
| 5,900,662 | A | 5/1999 | Frisina et al. |
| 5,914,893 | A | 6/1999 | Kozicki et al. |
| 6,055,180 | A | 4/2000 | Gudesen et al. |
| 6,060,338 | A | 5/2000 | Tanaka et al. |
| 6,064,589 | A | 5/2000 | Walker |
| 6,088,319 | A | 7/2000 | Gudesen |
| 6,118,684 | A | 9/2000 | Yihong et al. |
| 6,128,214 | A | 10/2000 | Kuekes et al. |
| 6,150,705 | A | 11/2000 | Chen |
| 6,288,697 | B1 | 9/2001 | Eto et al. |
| 6,292,396 | B1 | 9/2001 | Tailliet |
| 6,326,936 | B1 | 12/2001 | Inganas et al. |
| 6,349,054 | B1 | 2/2002 | Hidaka |
| 6,353,559 | B2 | 3/2002 | Hasegawa et al. |
| 6,384,427 | B1 | 5/2002 | Yamazaki et al. |
| 6,403,396 | B1 | 6/2002 | Gudesen et al. |
| 6,403,397 | B1 | 6/2002 | Katz |
| 6,407,953 | B1 | 6/2002 | Cleeves |
| 6,418,049 | B1 | 7/2002 | Kozicki et al. |
| 6,424,553 | B2 | 7/2002 | Berggren et al. |
| 6,426,891 | B1 | 7/2002 | Katori |
| 6,429,457 | B1 | 8/2002 | Berggren et al. |
| 6,432,739 | B1 | 8/2002 | Gudesen et al. |
| 6,449,184 | B2 | 9/2002 | Kato et al. |
| 6,459,095 | B1 | 10/2002 | Heath et al. |
| 6,461,916 | B1 | 10/2002 | Adachi et al. |
| 6,487,106 | B1 | 11/2002 | Kozicki |
| 6,627,944 | B2 * | 9/2003 | Mandell et al. ............. 257/315 |
| 2001/0014038 | A1 | 8/2001 | Hasegawa et al. |
| 2001/0054709 | A1 | 12/2001 | Heath et al. |
| 2001/0055384 | A1 | 12/2001 | Yamazaki et al. |
| 2002/0027819 | A1 | 3/2002 | Tomanek et al. |
| 2002/0101763 | A1 | 8/2002 | Hosogane et al. |
| 2002/0104889 | A1 | 8/2002 | Forrest et al. |
| 2002/0125504 | A1 | 9/2002 | Perlov et al. |
| 2002/0134979 | A1 | 9/2002 | Yamazaki et al. |
| 2002/0163030 | A1 | 11/2002 | Mandell et al. |
| 2002/0163057 | A1 | 11/2002 | Bulovic et al. |
| 2002/0163828 | A1 | 11/2002 | Krieger et al. |
| 2002/0163829 | A1 | 11/2002 | Bulovic et al. |
| 2002/0163830 | A1 | 11/2002 | Bulovic et al. |
| 2002/0163831 | A1 | 11/2002 | Krieger et al. |
| 2002/0168820 | A1 | 11/2002 | Kozicki et al. |

FOREIGN PATENT DOCUMENTS

| | | | | |
|---|---|---|---|---|
| EP | 0 268 370 | A3 | 5/1988 | |
| EP | 0 385 688 | A2 | 9/1990 | |
| EP | 0 727 822 | A2 | 8/1996 | |
| JP | 7-106440 | | 4/1995 | |
| RU | 2071126 | C1 | 12/1996 | |
| WO | WO 93/04506 | A1 | 3/1993 | |
| WO | PCT WO 98/58383 | * | 6/1998 | ........... G11C/11/42 |
| WO | WO 99/04440 | A1 | 1/1999 | |
| WO | WO 99/08325 | A2 | 2/1999 | |
| WO | WO 99/14762 | A1 | 3/1999 | |
| WO | WO 99/19900 | A2 | 4/1999 | |
| WO | WO 00/26918 | A1 | 5/2000 | |
| WO | WO 00/48196 | A1 | 8/2000 | |
| WO | WO 02/35580 | A2 | 5/2002 | |
| WO | WO 02/37500 | A1 | 5/2002 | |
| WO | WO 02/43071 | A1 | 5/2002 | |
| WO | WO 02/078003 | A2 | 10/2002 | |
| WO | WO 02/091384 | A1 | 11/2002 | |
| WO | WO 02/091385 | A1 | 11/2002 | |
| WO | WO 02/091476 | A1 | 11/2002 | |
| WO | WO 02/091494 | A1 | 11/2002 | |
| WO | WO 02/091495 | A2 | 11/2002 | |
| WO | Wo 02/091496 | A2 | 11/2002 | |
| WO | WO 03/017282 | A1 | 2/2003 | |

OTHER PUBLICATIONS

Zhou, C. et al., "Nanoscale Metal/Self–Assembled Monolayer/Metal Heterostructures," *Applied Physics Letters*, vol. 71, No. 5, pp. 611–613, Aug. 4, 1997.

"A Disrupted Organic Film: Could Memories Be Made of This?," *ORNL Review*, vol. 33, No. 2, 2000.

"Technical Summary of Programmable Metallization Cell Memory Technology," Version 1.3, Dec. 2001.

"The 1998 Conference Archive," *The Sixth Foresight Conference on Molecular Nanotechnology*, Nov. 12–15, 1998, www.foresight.org/Conferences/MNT6/index.html.

Beck, A. et al., "Reproducible Switching Effect in Thin Oxide Films for Memory Applications," *Applied Physics Letters*, vol. 77, No. 1, pp. 139–141, Jul. 3, 2000.

Bernard, Allen, "A Big Name in Chips Helps Coature in Molecular Memory Race," Aug. 27, 2000, www.nanoelectronicsplanet.com/features/article/0,4028,6571–1452831, 00.html.

Chen, J. et al., "Room–temperature Negative Differential Resistance in Nanoscale Molecular Junctions," *Applied Physics Letters*, vol. 77, No. 8, Aug. 21, 2000.

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

GAO, H.J. et al., "Reversible, Nanometer–Scale Conductance Transitions in an Organic Complex," *Physical Review Letters*, vol. 84, No. 8, pp. 1780–1783, Feb. 21, 2000.

GAO, H. J. et al., "Using a New Kind of Organic Complex System of Electrical Bistability for Ultrahigh Density Data Storage," *J. Vac. Sci. Technol. B* vol. 15, No. 4, pp. 1581–1583, Jul./Aug. 1997.

International Search Report, PCT/RU01/00334, search completed Feb. 14, 2002.
International Search Report, PCT/US02/14236, search completed Aug. 14, 2002.
International Search Report, PCT/US02/14237, search completed Sep. 9, 2002.
International Search Report, PCT/US02/14238, search completed Aug. 9, 2002.
International Search Report, US02/14239, search completed Aug. 20, 2002.
International Search Report, PCT/US02/14269, search completed Mar. 27, 2003.
International Search Report, PCT/US02/14270, search completed Mar. 28, 2003.
Japanese patent abstract of publication No. 01–103137, Apr. 20, 1989.
Japanese patent abstract of publication No. 01278781, Nov. 9, 1989.
Japanese patent abstract of publication No. 61107723, May 26, 1986.
Japanese patent abstract of publication No. 63293729, Nov. 30, 1998.
Krieger, Ju. H. et al., "Molecular Analogue Memory Cell Based on Electrical Switching and Memory in Molecular Thin Films," *Synthetic Metals*, 7730 (2000), pp. 1–4.
Krieger, Juri H. et al., "Molecular Analogue Memory Cell, *Sixth Foresight Conference on Molecular Nanotechnology*, Santa Clara, California, Nov. 12–15, 1998.
Krieger, Yu. G. et al., "Study of Test Structures of a Molecular Memory Element," *Institute of Inorganic Chemistry*, Siberian Branch, Russian Academy of Sciences, Translated from *Zhurnal Strukturnoi Khimii*, vol. 34, No. 6, pp. 152–156, Nov.–Dec. 1993, Original article submitted Apr. 27, 1993.

Krieger, Yu. G., "Molecular Electronics: Current State and Future Trends," *Journal of Structural Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852, Aug. 10, 1998.

Ma, L.P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297–298, Feb. 1989.

Ovshinsky, Stanford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 1979.

* cited by examiner

MOLECULAR MEMORY DEVICE

RELATED APPLICATIONS

This application contains subject matter related to the subject matter disclosed in copending U.S. Provisional Patent Application Serial No. 60/289,056, filed on May 7, 2001, entitled "Electrically Addressable Memory Switch With Built-In Leakage Current Barrier".

FIELD OF THE INVENTION

The invention relates to a memory device, and more particularly to a memory device including a molecular system with ionic complexes distributed in the system.

BACKGROUND OF THE INVENTION

Various types of electrically addressable memory devices for computer data storage are known in the art. Most of these devices store a data bit as a charge in a capacitor. The charge state can be read out and the output signal used to control processes in a computer processor. Most of these devices require complex silicon processing steps and a dedicated device architecture which depends on memory type.

Memory devices are distinguished by their speed and data retention characteristic. Dynamic random access memory (DRAM) is a volatile memory characterized by a destructive read. This means that it is necessary to supply voltage to the memory bits at all times, or the information will disappear. Furthermore, each memory element has associated with it a transistor. Static random access memory (SRAM) stores data in a bistable flip-flop, commonly consisting of cross-coupled inverters. It is called "static" because it will retain a value as long as power is supplied. It is still volatile, i.e. it will lose its contents when the power is switched off, in contrast to ROM. SRAM is usually faster than DRAM, but each bit requires several transistors (about six), so that a lesser number of bits of SRAM fit in the same area as compared to DRAM.

Erasable programmable read only memory (EPROM) is a type of storage device in which the data is determined by electrical charge stored in an isolated ("floating") MOS transistor gate. The isolation is good enough to retain the charge almost indefinitely (more than ten years) without an external power supply. The EPROM is programmed by "injecting" charge into the floating gate, using a technique based on the tunnel effect. This requires higher voltage than in normal operation (usually 12V–25V). The floating gate can be discharged through UV-illumination or electrically (EEPROM). Usually bytes or words can be erased and reprogrammed individually during system operation. EEPROM is more expensive and less dense than RAM. It is appropriate for storing small amounts of data which is changed infrequently. Another known non-volatile memory device is a ferromagnetic RAM (Fe-RAM), wherein the individual storage cells do not require a dedicated transistor.

When using passive memory devices connected in parallel, e.g., in form of an array, leakage current problems can occur. Leakage problems can be reduced, for example, by forming a Schottky barrier between an organometallic charge-transfer complex, such as M(TCNQ) and the underlying electrode. Alternatively, it has been proposed to provide a rectifying diode in series with the switching resistance at each intersection point of a memory array. This requires additional layers and processing steps.

The molecular composite material can have stable and metastable states that affect the retention time of the device. The device has an electrically insulating off state and at least one electrically conducting on state. The device can be switched reproducibly between the on state(s) and the off state by applying an electrical field across the device with a predetermined polarity and magnitude for a predetermined time.

It would therefore be desirable to provide a device that has a built-in barrier that reduces leakage currents.

SUMMARY OF THE INVENTION

The present invention provides a novel memory cell comprising an active region including a molecular system. Ionic complexes may be distributed in the molecular system. At least one write electrode applies an electric field to the active region to write information to the active region, and at least one read electrode is provided for reading the information from the active region.

In accordance with an aspect of the invention, the memory cell may includes a pair of write electrodes for writing information to the memory cell, and the active region responsive to an electric field applied between the first and second write electrodes for switching between an on state and an off state. A pair of read electrodes detect whether the active region is in the on state or in the off state to read the information from the memory cell.

In accordance with another aspect of the invention, a memory device includes a memory cell array composed of multiple memory cells arranged in row and column directions. Each memory cell comprises an active region including a molecular system and ionic complexes distributed in the molecular system, first and second write electrodes for applying an electric field to the active region, to write information to the memory cell, and first and second read electrodes for detecting electrical conductivity of the active region, to read the information from the memory cell.

In accordance with another aspect of the invention, a memory cell in a memory device including a memory cell array composed of multiple memory cells arranged in row and column directions, comprises first and second barrier elements arranged in contact with the active region to reduce leakage current.

In accordance with an embodiment of the invention, the first barrier element may be made of material having a work function different from a work function of the second barrier element. For example, the first and second barrier elements may be made of different metals.

Different materials having different work functions may be used for the read electrodes, causing the resistance of a memory cell to be substantially different in a forward biased and reverse biased readout configuration. The write operation, on the other hand, is unaffected by the difference in the work function of the readout electrodes.

Further features and advantages of the present invention will be apparent from the following description of preferred embodiments.

BRIEF DESCRIPTION OF THE DRAWINGS

The following figures depict certain illustrative embodiments of the invention. These depicted embodiments are to be understood as illustrative of the invention and not as limiting in any way.

DETAILED DESCRIPTION OF CERTAIN ILLUSTRATED EMBODIMENTS

Figure 1:
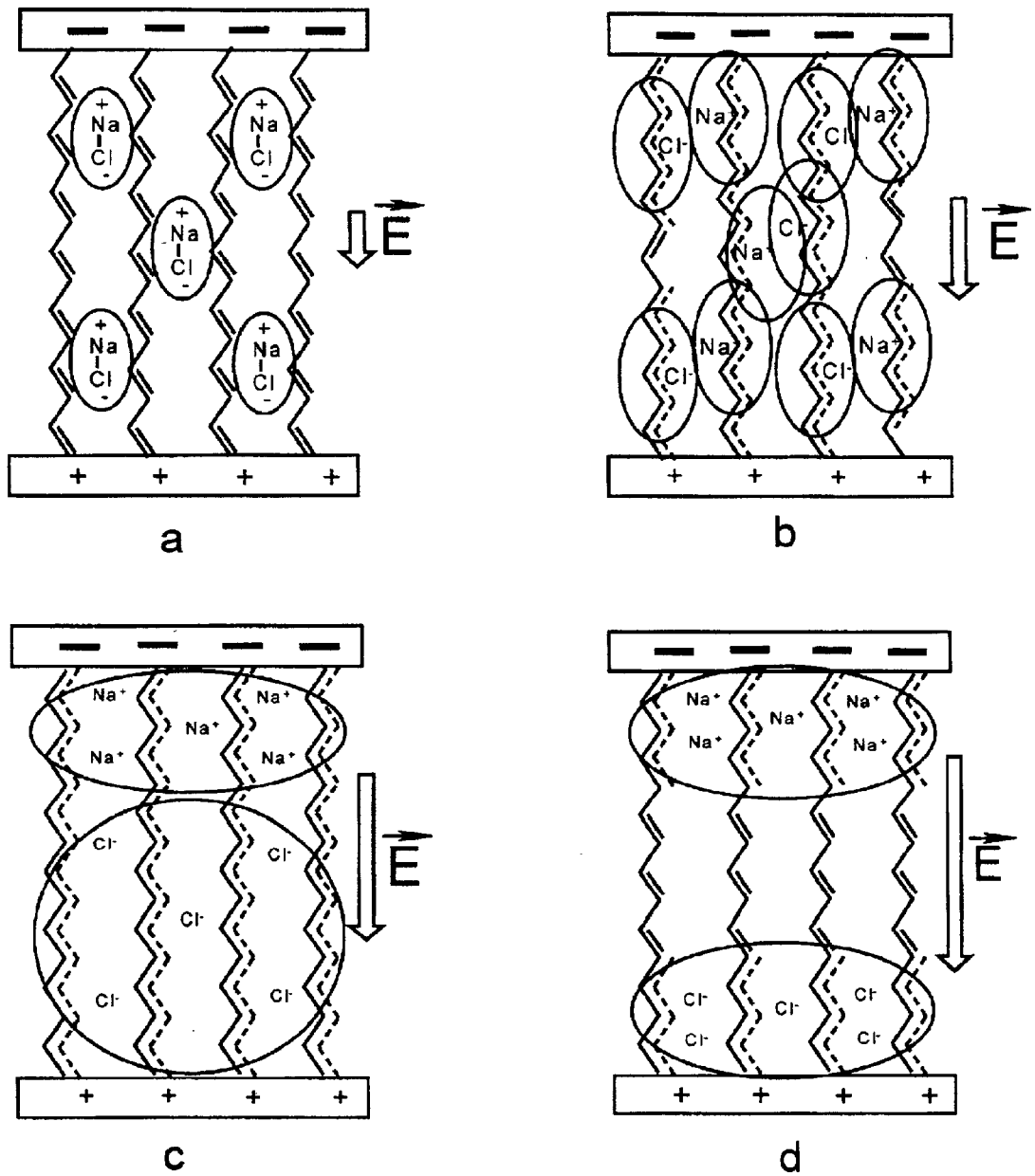
FIGS. 1a–1d show a simplified structure of a molecular composite memory cell in various operational states.

The present invention addresses and solves problems related to providing a novel memory device. The present invention overcomes these problems in part, by the provision of write and read electrodes adjacent an active region made of a molecular ensemble that exhibits a reproducible switching and memory effect applicable in macroscopic devices. The material of the active region is a composite material system that exhibits structural electronic instability in one dimension and enables static and dynamic control over the conductivity of such molecular systems. The mechanism for the memory and switching effect of these cells appears to be related to the structural electronic instability of one-dimensional molecular systems and associated with the dissociation of molecules and/or displacement of atoms in an external electrical field.

The development of molecular electronics stimulated the more detailed research of electrophysical characteristics of thin molecular films which offer new physical effects that may result in new technologies for electrical switching and memory applications. Although first reported in the 1960's, a generally accepted interpretation of such phenomena is still lacking. This is partly due to the non-reproducibility of the results, even when using identical compounds.

A number of different materials may be used as the molecular composite material. Exemplary materials are described below, but are also discussed in an article by Yu H. Krieger, entitled, "Structural Instability of One-Dimensional Systems As A Physical Principle Underlying The Functioning of Molecular Electronic Devices", Journal of Structural Chemistry, Vol. 40, No. 4, 1999 (Yu H. Krieger), expressly incorporated by reference herein.

Many molecular memory cells can be made of a one-dimensional conductive molecular systems exhibiting structural instability. (Peierls-effect). These tend to have an S-shaped (reentrant) voltage-current characteristic with memory. The impedance of such memory cells can be between ~10 MΩ and ~100 Ω, depending on the switching condition.

There are two predominant types of structural organization of such systems. First, these are strands of linear conjugated polymers, which are weakly bonded to each other and whose mutual arrangement is generally poorly organized. Second, these are crystal structures, where the individual molecules form one-dimensional columns and interact with each other much more actively than molecules from different columns do. Recently, molecular systems of both types were synthesized.

Polyconjugated systems primarily involve polyvinylenes, i.e., polymers with an acyclic conjugation system, in which the one-dimensional character of structure is dictated by the mechanism of conjugation in linear macromolecules. Polyacetylene is a classical representative of this class of polymers. Its electronic structure is a prototype for many other conjugated polymers.

Another wide class of molecular compounds formed from aromatic and heterocyclic molecules which possess high electric conductivity due to π-bonds between molecules. Such molecular systems are called π-complexes or charge transfer complexes, with those systems whose structure involves isolated one-dimensional columns or strands possessing pronounced electro-physical properties of interest for switching an memory applications. Molecular charge transfer complexes are donor-acceptor systems formed from two molecules: one possessing donor and another acceptor properties. Among the well-defined complexes with a one-dimensional structure, tetra-cyano-quino-dimethane (TCNQ) are planar molecules with unsaturated bonds, arranged in a crystal as parallel stacks forming a quasi-one-dimensional system.

In another class of one-dimensional systems, the cations are dynamically disordered. It involves molecular compounds having the general formula $(TMTSF)_2X$. Transition metal salts of $K_2 Pt(CN)_4 Br_{0.3} \times 3H_2O$ (KCP) type are also the typical representatives of mixed-valence quasi-one-dimensional complexes, as are phthalocyanines and porphyrins. Moreover, pure inorganic compounds, such as $NbSe_3$, are also interesting examples of compounds with quasi-one-dimensional structure.

An exemplary molecular composite that forms part of a simplified molecular memory cell (MC) is shown in FIGS. 1a–1d. The molecular composite includes a quasi-one-dimensional—or at least structurally and electrically anisotropic—molecular matrix, wherein ionic complexes are distributed in the matrix. Polyconjugated compounds, such as the exemplary quasi-one-dimensional systems described above, for example, polyphenylacetylene, can be used as the anisotropic molecular matrix. The ionic complex can be a salt, such as sodium chloride (NaCl), cesium chloride (CsCl), or any other material that can dissociate in an applied electric field. The exemplary anisotropic molecular matrix is depicted in FIGS. 1a–1d as consisting of an assembly of chain-like molecules oriented perpendicular to the electrode surfaces. However, other orientations of those molecules or of anisotropic "channels" are possible as long as a charge separation of the type depicted in FIGS. 1a–1d is enabled.

While not being bound by theory, the following is currently believed by the inventors to describe the mechanism for the conductivity change of the molecular composite material. Electric switching in the molecular thin films depicted in FIGS. 1a–1d is characterized by the existence of two stable states, a high impedance state (off state) and a low impedance state (on state). The impedance of this off state is usually more than ~10 MΩ. Switching from the to the on state occurs when an applied electric field exceeds a threshold value. The impedance of this on state is less than ~100 Ω. A transition from on state back to the off state takes place when the polarity of the electric field is reversed.

Two modes of the memory cell operation can be identified: the metastable mode (FIG. 1b) and stable mode (FIG. 1c). The stable mode of the memory cell operation may be characterized by a high threshold voltage level for switching between the off state and the on state (in the range of about 3–10V), low impedance of the on state (less than 100 Ω), long switching time (1 ms and more) and long storage time (more than two month). Some memory cells exhibit substantially unchanged electrical properties after storage for six years.

Conversely, the metastable mode of the memory cell function is characterized by a low threshold voltage level for switching between the off state and the on state (in the range of about 0.1–0.5V), high impedance of the on state (wide region, about 1 kΩ–1MΩ), short switching time (less than 1 μs), and short storage time (between about 10 s and several hours).

FIG. 1a illustrates the off state, where the electrical conductivity is essentially zero, assuming that the anisotropic molecular matrix itself is a good electrical insulator. When an external electric field E is applied, as indicated in FIG. 1b, the sodium salt dissociates into sodium and chlorine ions, and the ions are displaced from their original position in the anisotropic molecular matrix, resulting in an increase in the electrical conductivity of the MC (on state) to the metastable state. Upon further increase of the electric field, the ions become more strongly separated (FIG. 1c), accompanied by a still further increase in the conductivity of the MC, which attains the above-described stable state. When a very large field is applied over a long time, the anions and cations accumulate at the electrodes (FIG. 1d), resulting in a sharp decrease in the electrical conductivity of the MC due to the absence of mobile charges ("off" state).

Figure 2:
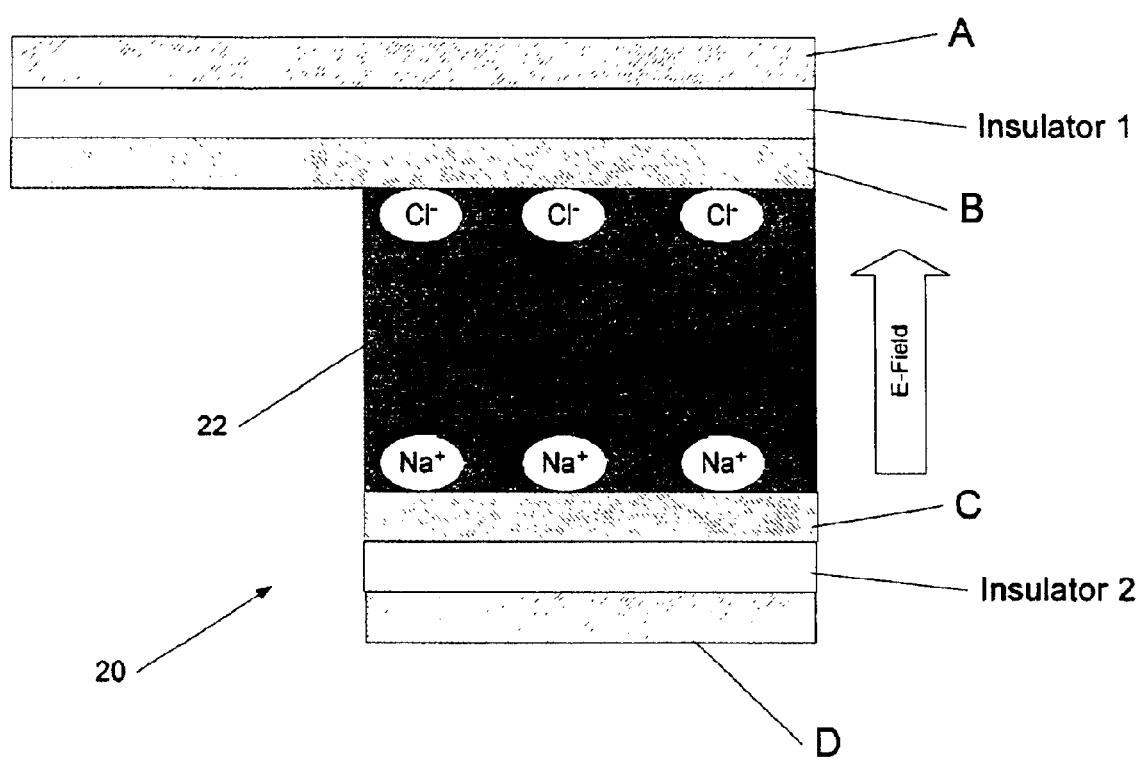
FIG. 2 shows an exemplary four-terminal device in an on state according to an embodiment of the present invention.

Referring now to FIG. 2, a four-terminal memory cell 20 according to an embodiment of the present invention includes an upper write electrode A, an upper read electrode B insulated from the upper write electrode A by an insulator 1, a lower read electrode C, a lower write electrode D, an insulator 2 disposed of between the lower read electrode C and the lower write electrode D for insulation purposes, and an active layer 22 made of composite material described above with reference to FIG. 1. For example, the active layer 22 may be provided in contact with each of the lower and upper read electrodes B and C.

When an electric field is applied between the write electrodes A and D, the ionic NaCl complex dissociates into $Na^+$ and $Cl^-$ ions. If the potential at the electrode A is positive with respect to the potential at the electrode D, the negatively charged $Cl^-$ ions migrate towards the positive write electrode A, whereas the positively charged $Na^+$ ions migrate towards the negative write electrode D. For example, to provide a writing operation, the write electrode A may be grounded, whereas a negative potential, e.g. −10 V, may be applied to the electrode D.

The read electrodes B and C as well as the insulators 1 and 2 prevent the ions from actually reaching the write electrodes A and B, which only provide the electric field. As a result, as discussed above with reference to FIG. 1, the electrical conductivity of the composite material layer 22 increases so that electric current can pass between the read electrode B and the read electrode C. This state corresponds to the on state of the device 40.

An erasing operation may be provided by applying between the write electrode A and the write electrode D an electric field having polarity opposite with respect to the polarity of the electric field applied to provide the writing operation. During the erasing operation, the device 40 is switched from its conducting state (on state) to its non-conducting state ("off" state). For example, to provide the erasing operation, the write electrode A may be grounded, whereas a positive potential, e.g. +10 V, may be supplied to the write electrode D.

A reading operation may be provided by measuring the impedance of the active layer 22 between the read electrodes B and C. To support the reading operation, the electrode B may be grounded, and a small negative potential, e.g. −0.1 V may be supplied to the electrode C.

The device 20 may be a four-terminal memory cell of a memory device including a memory cell array composed of multiple memory cells arranged in row and column directions, wherein the electrodes A and B can form, for example, the row electrodes of the memory cell array, and the electrodes C and D can form the column electrodes of the memory cell array.

Figure 3:
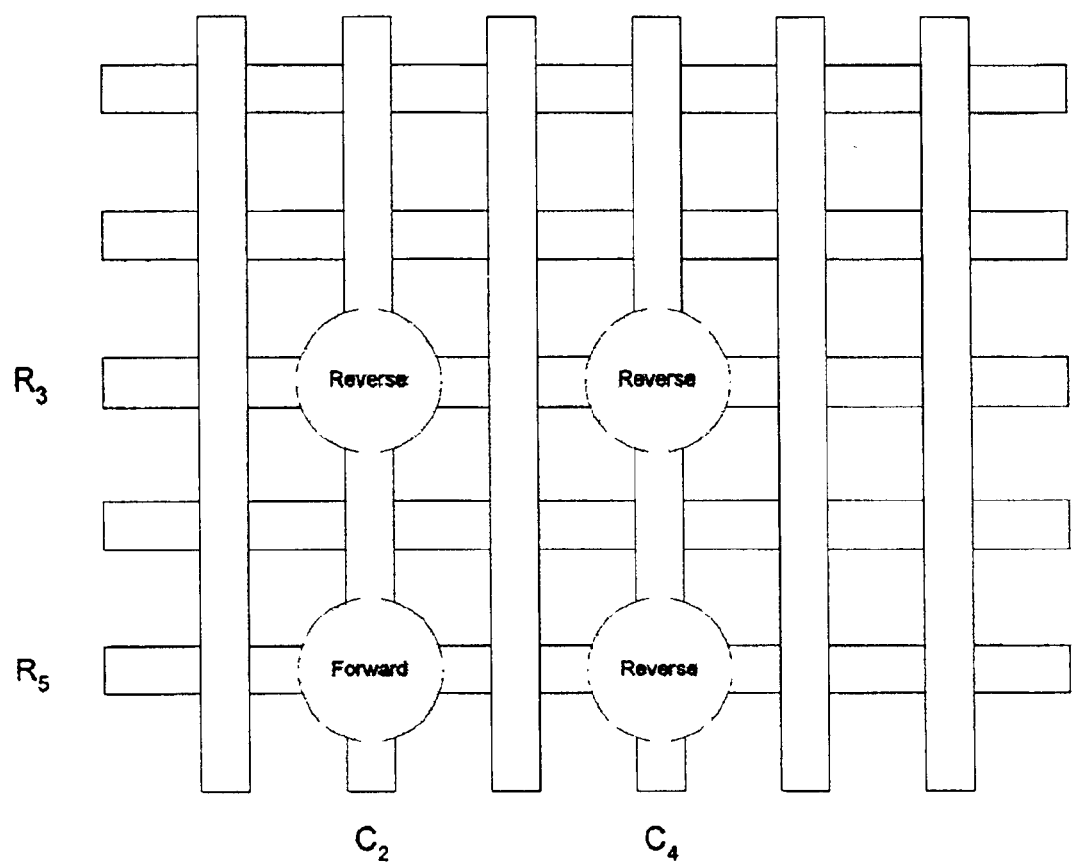
FIG. 3 shows an array of memory cells, with an exemplary leakage current path indicated.

FIG. 3 schematically illustrates the memory cell array of the present invention. When a particular memory cell of the memory cell array located, for example in the fifth row (R5) and the second column (C2) is read out, then a leakage current can also flow by a large number of cells. FIG. 3 illustrates an exemplary path for the leakage current via cells arranged at nodes [R5,C4], [R3,C4], and [R3,C2] of the memory cell array, where R and C respectively identify the row and column addresses of a particular node. Since many such paths are available, only a small cell resistance in the reverse direction can make it impossible to reliably read out the information stored, for example, in the cell arranged at node [R5,C2].

Figure 4:
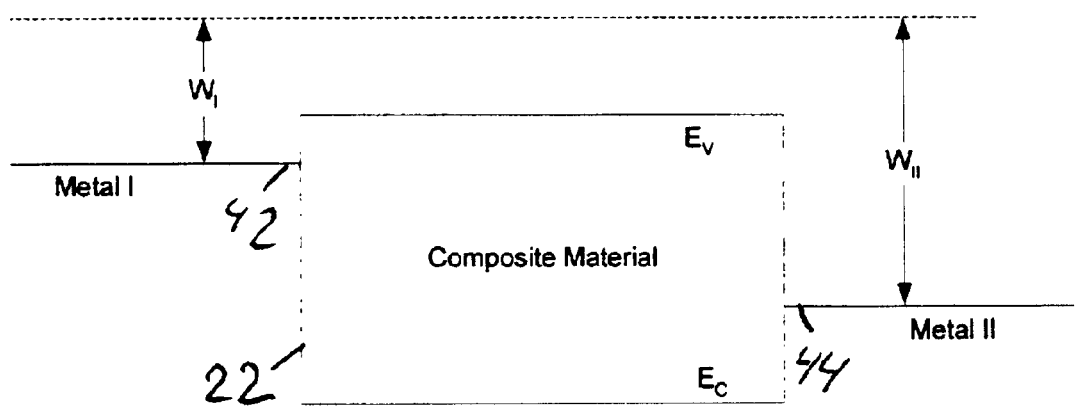
FIG. 4 shows a schematic band diagram of a composite material with two different work function contact metals according to an embodiment of the present invention.

Referring to FIG. 4, the cell resistance can be increased substantially in the reverse direction by providing contacts to the composite layer 22 using barrier elements 42 and 44 made of different materials, such as Metal I and Metal II with different work functions WI and WII, respectively. The conduction band and valence band quasi-Fermi levels of the composite material are indicated in FIG. 4. It is clearly seen that electronic carriers, e.g., electrons, passing through the active layer 22 from Metal II into Metal I have to overcome a substantially larger potential barrier that electrons moving in the opposite direction. Suitable metals for a low work function Metal I are, for example, Al, Mg, Ag and In, whereas suitable metals or materials for a high work function Metal II are, for example, Au and Indium-Tin-Oxide (ITO). It is therefore possible to design memory cells with low leakage currents using the composite material disclosed herein.

The barrier elements 42 and 44 made of different materials having different work functions may be used as read electrodes for reading information from a memory cell by detecting impedance of the active layer 22 between the elements 42 and 44. The barrier elements having different work functions cause the impedance of the memory cell to be substantially different in a forward biased and reverse biased readout configuration. The writing operation, on the other hand, is unaffected by the difference in the work function of the readout electrodes.

While the invention has been disclosed in connection with the preferred embodiments shown and described in detail, various modifications and improvements thereon will become readily apparent to those skilled in the art.

What is claimed is:

1. A memory cell comprising:
   an active region including a molecular system and ionic complexes,
   at least one write electrode for applying an electric field to the active region to write information to the active region, and
   at least one read electrode for reading the information from the active region.

2. The memory cell of claim 1, wherein the active region has a low-impedance state and a high-impedance state.

3. The memory cell of claim 2, wherein the active region is responsive to the applied electric field by switching from the high-impedance state to the low-impedance state to write the information.

4. The memory cell of claim 3, wherein impedance of the active region is detected to read the information.

5. The memory cell of claim 4, wherein the active region is configured to switch to the low-impedance state when intensity of the applied electric field of a first polarity exceeds a threshold value.

6. The memory cell of claim 5, wherein the active region is configured to return to the high-impedance state when an electric field of a second polarity opposite with respect to the first polarity is applied to the active region.

7. The memory cell of claim 6, wherein the writing electrode is arranged for providing the electric field of the second polarity.

8. The memory cell of claim 1, wherein the read electrode is provided in contact with the active region.

9. The memory cell of claim 8, further comprising an insulator provided between the read electrode and the write electrode.

10. The memory cell of claim 1, wherein an ionic complex includes ions of Na and Cl.

11. The memory cell of claim 1, wherein an ionic complex includes ions of Cs and Cl.

12. The memory cell of claim 1, wherein the molecular system includes a quasi-one-dimensional molecular matrix.

13. The memory cell of claim 1, wherein the molecular system includes a structurally and electrically anisotropic molecular matrix.

14. The memory cell of claim 1, wherein the molecular system includes a polyconjugated compound.

15. The memory cell of claim 1, wherein the molecular system includes aromatic molecules.

16. The memory cell of claim 1, wherein the molecular system includes heterocyclic molecules.

17. The memory cell of claim 1, wherein the molecular system includes porphyrin.

18. The memory cell of claim 1, wherein the molecular system includes phtalocyanines.

19. The memory cell of claim 1, wherein the molecular system includes anisotropic inorganic material.

20. The memory cell of claim 1, further comprising first and second barrier elements arranged in contact with the active region to reduce leakage current.

21. The memory cell of claim 20, wherein the first barrier element is made of material having a first work function, and the second barrier element is made of material having a second work function different from the first work function.

22. The memory cell of claim 21, wherein the first and second barrier elements are made of different metals.

23. A memory cell comprising:
first and second write electrodes for writing information to the memory cell,
an active region including a molecular system, and responsive to an electric field applied between the first and second write electrodes for switching between an on state and an off state, wherein the active region further comprises ionic complexes distributed in the molecular system; and
first and second read electrodes for detecting whether the active region is in the on state or in the off state to read the information from the memory cell.

24. The memory cell of claim 23, wherein the active region is configured to have a low impedance in the on state and a high impedance in the off state.

25. The memory cell of claim 24, wherein the active region is responsive to the applied electric field of a first polarity by switching from the off state to the on state to provide writing the information.

26. The memory cell of claim 25, wherein the active region is responsive to an electric field of a second polarity applied between the first and second write electrodes by switching from the on state to the off state, to provide erasing the written information, the second polarity is opposite with respect to the first polarity.

27. The memory cell of claim 23, wherein the active region is provided in electrical contact with the first and second read electrodes.

28. The memory cell of claim 27, further comprising a first insulating layer provided between the first read electrode and the first write electrode.

29. The memory cell of claim 28, further comprising a second insulating layer provided between the second read electrode and the second write electrode.

30. A method of storing information using a storage device having an active region including a molecular system and ionic complexes distributed in the molecular system, the method comprising:
applying an electric field of a first polarity between a first pair of electrodes surrounding the active region, to write information into the storage device, and
detecting electrical conductivity of the active region using a second pair of electrodes surrounding the active region, to read the information from the storage device.

31. The method of claim 30, further comprising applying an electric field of a second polarity between the first pair of electrodes, to erase the information written to the storage device, the second polarity is opposite with respect to the first polarity.

32. A memory device including a memory cell array composed of multiple memory cells arranged in row and column directions, each memory cell comprising:
an active region including a molecular system and ionic complexes distributed in the molecular system,
first and second write electrodes for applying an electric field to the active region, to write information to the memory cell, and
first and second read electrodes for detecting electrical conductivity of the active region, to read the information from the memory cell.

33. The memory device of claim 32, wherein the first write electrode and the first read electrode are row electrodes of the memory cell array.

34. The memory device of claim 33, wherein the second write electrode and the second read electrode are column electrodes of the memory cell array.

35. The memory device of claim 34, further comprising a first insulating layer between the first write electrode and the first read electrode, and a second insulating layer between the second write electrode and the second read electrode.

36. The memory device of claim 35, wherein the first and second read electrodes are provided in contact with the active region.

37. The memory device of claim 32, wherein the first and second read in contact with the active region to reduce leakage electrodes are arranged current.

38. The memory device of claim 37, wherein the first read electrode is made of material having a first work function, and the second read electrode is made of material having a second work function different from the first work function.

39. The memory device of claim 38, wherein the first and second read electrodes are made of different metals.

40. A memory device including a memory cell array composed of multiple memory cells arranged in row and column directions, each memory cell comprising:
an active region including a molecular system that comprises ionic complexes, and
first and second barrier elements arranged in contact with the active region to reduce leakage current.

41. The memory device of claim 40, wherein the first barrier element is made of material having a first work function, and the second barrier element is made of material having a second work function different from the first work function.

42. The memory device of claim 41, wherein the first and second barrier elements are made of different metals.

43. The memory device of claim 41, wherein the material of the first barrier element is selected from the group consisting of Al, Mg, Ag, and In.

44. The memory device of claim 43, wherein the material of the second barrier element is selected from the group consisting of Au and Indium-Tin-Oxide.

45. The memory device of claim 40, wherein the first and second barrier elements are read electrodes for reading information from the memory cell by detecting impedance of the active region between the read electrodes.

* * * * *